(12) United States Patent
Hsiao

(10) Patent No.: US 6,324,058 B1
(45) Date of Patent: Nov. 27, 2001

(54) HEAT-DISSIPATING APPARATUS FOR AN INTEGRATED CIRCUIT DEVICE

(76) Inventor: Chieh-Jen Hsiao, 2F, No. 215, Yu-Te Rd., Pei Dist., Taichung City (TW)

( * ) Notice: Subject to any disclaimer, the term of this patent is extended or adjusted under 35 U.S.C. 154(b) by 0 days.

(21) Appl. No.: 09/696,903

(22) Filed: Oct. 25, 2000

(51) Int. Cl.[7] ....................................... H05K 7/20
(52) U.S. Cl. ................... 361/699; 62/3.2; 62/3.7; 62/259.2; 136/203; 136/204; 165/80.4; 165/185; 257/714; 361/704; 361/719
(58) Field of Search ................. 62/3.2, 3.4, 3.6, 62/3.7, 259.2; 136/203, 204; 165/80.2, 80.3, 80.4, 185; 174/16.3; 257/706–707, 712–714; 361/688–689, 698–699, 704, 707, 710, 715, 719–721

(56) References Cited

U.S. PATENT DOCUMENTS

| | | | |
|---|---|---|---|
| 3,212,274 | * 10/1965 | Eidus | ........................................ 62/3.2 |
| 6,073,449 | * 6/2000 | Watanabe et al. | ........................ 62/3.2 |
| 6,233,959 | * 5/2001 | Kang et al. | ........................... 62/259.2 |
| 6,233,980 | * 5/2001 | Kang et al. | ........................... 62/259.2 |

* cited by examiner

Primary Examiner—Gregory Thompson
(74) Attorney, Agent, or Firm—Brooks & Kushman P.C.

(57) ABSTRACT

A heat dissipating apparatus includes a base member that has an upright surrounding wall portion confining a receiving space, and a top wall for closing a top side of the receiving space. The base member is adapted to be disposed on a circuit board with an integrated circuit device accommodated within the receiving space. The top wall is formed with a serpentine fluid groove that opens downwardly, and that has a fluid inlet in fluid communication with a first groove end, and a fluid outlet in fluid communication with a second groove end. A thermoelectric cooling unit is disposed in the receiving space, and has a heat-absorbing side adapted to be placed in contact with a heat-generating side of the integrated circuit device, and a heat-releasing side opposite to the heat-absorbing side. The cooling unit is adapted to separate the integrated circuit device from the fluid groove. A washer member is disposed in the receiving space below the cooling unit. The washer member has an inner peripheral portion formed with a through hole to contain the integrated circuit device therein, an outer peripheral portion in a fluid-tight seal with the surrounding wall portion, a top surface in a fluid-tight sea with the heat-absorbing side, and a bottom surface in a fluid-tight seal with the circuit board.

8 Claims, 5 Drawing Sheets

HEAT-DISSIPATING APPARATUS FOR AN INTEGRATED CIRCUIT DEVICE

BACKGROUND OF THE INVENTION

1. Field of the Invention

The invention relates to a heat-dissipating apparatus for an integrated circuit device, more particularly to a heat-dissipating apparatus that is simple to manufacture and assemble and that prevents condensation of water droplets therein.

2. Description of the Related Art

Electronic devices, such as integrated circuit devices, generate heat during operation. The heat or rise in temperature will affect the dynamic characteristics of an electronic device and hence shorten the service life thereof. A heat-dissipating apparatus can help dissipate the heat of the electronic device to thereby prolong the service life and increase the operational speed thereof.

A conventional heat-dissipating apparatus is shown in FIG. 1. As illustrated, the heat-dissipating apparatus includes a cooling fin member 1 and a fan 2 mounted on top of the cooling fin member 1. During operation, the heat generated by an integrated circuit device is transferred to the cooling fin member 1, and the fan 2 generates a current of air to dissipate the heat transferred to the cooling fin member 1. However, as air is not a good heat conductor, the heat-dissipating effect of the fan 2 is not satisfactory. Besides, in order not to obstruct the discharge of hot air by the fan 2, the fan 2 and hence the integrated circuit device cannot be disposed too close to a wall surface, thereby affecting the utility of the apparatus.

FIG. 2 shows another conventional heat-dissipating apparatus. As illustrated, a thermoelectric cooling unit 5 is disposed between an integrated circuit device 3 and a fan 4. The fan 4 and the cooling unit 5 are secured on a circuit board 7 by using a mounting bracket 6. The cooling unit 5 is a semiconductor device that includes an array of N-type semiconductor units 501, P-type semiconductor units 502, and metal conductors 503 interconnecting the N-type and P-type semiconductor units 501, 502. First and second ceramic sheets 504, 505 are respectively disposed on upper and lower sides of the array. The first ceramic sheet 505 has a top side forming a heat-releasing side, while the second ceramic sheet 505 has a bottom side in contact with the integrated circuit device 3 and forming a heat-absorbing side. When an electric current is passed through the metal conductors 503, electrons move from the negative pole and through the P-type semiconductor units 502, where heat is absorbed, and to the adjacent N-type semiconductor units 501, where heat is released. At each passage of the electrons through one NP module, there is a transfer of heat from one side to the other, thereby creating a temperature difference at the heat-absorbing and heat-releasing sides. The arrangement of the cooling unit 5 can thus transfer the heat generated by the integrated circuit device 3 via the ceramic sheet 505 at the heat-absorbing side to the ceramic sheet 504 at the heat-releasing side so as to be dissipated to the outside through the use of the fan 4.

Although the heat-dissipating apparatus of FIG. 2 provides a better heat-dissipating effect over that of FIG. 1, since the integrated circuit device 3 is only in contact with the central portion of the heat-absorbing side, condensation of water droplets may occur at the remaining portion of the heat-absorbing side, where the temperature is likewise relatively low, when exposed to the ambient air. The water droplets may drip to the circuit board 7 therebelow, thereby resulting in short-circuit and shortened service life for the circuit board 7. Moreover, the dissipation of heat by using air currents generated by the fan 4 is also inefficient since air is not a good heat conductor.

SUMMARY OF THE INVENTION

Therefore, the main object of the present invention is to provide a heat-dissipating apparatus for an integrated circuit device that provides an enhanced heat-dissipating effect and that prevents condensation of water droplets therein.

Accordingly, a heat dissipating apparatus of this invention is adapted to dissipate heat released from a heat-generating side of an integrated circuit device that is mounted on a circuit board. The heat-dissipating apparatus includes a base member, a thermoelectric cooling unit and a washer member. The base member has an upright surrounding wall portion and a top wall. The surrounding wall portion confines a receiving space with an area larger than the integrated circuit device. The top wall is formed on a top end of the surrounding wall portion so as to close a top side of the receiving space. The base member is adapted to be disposed on the circuit board such that the integrated circuit device is accommodated within the receiving space. The top wall has an upper wall surface, and a lower wall surface opposite to the upper wall surface and formed with a serpentine fluid groove that opens downwardly and that has opposing first and second groove ends. The top wall further has a fluid inlet in fluid communication with the first groove end, and a fluid outlet in fluid communication with the second groove end. The thermoelectric cooling unit is disposed in the receiving space below the top wall, and has a heat-absorbing side adapted to be placed in contact with the heat-generating side of the integrated circuit device, and a heat-releasing side opposite to the heat-absorbing side. The cooling unit has a size corresponding to the area of the receiving space, and is adapted to separate the integrated circuit device from the fluid groove. The washer member is disposed in the receiving space below the cooling unit. The washer member has inner and outer peripheral portions, and top and bottom surfaces. The inner peripheral portion is formed with a through hole that is adapted to contain the integrated circuit device therein. The outer peripheral portion establishes a fluid-tight seal with the surrounding wall portion of the base member. The top surface establishes a fluid-tight seal with the heat-absorbing side of the cooling unit. The bottom surface is adapted to establish a fluid-tight seal with the circuit board.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
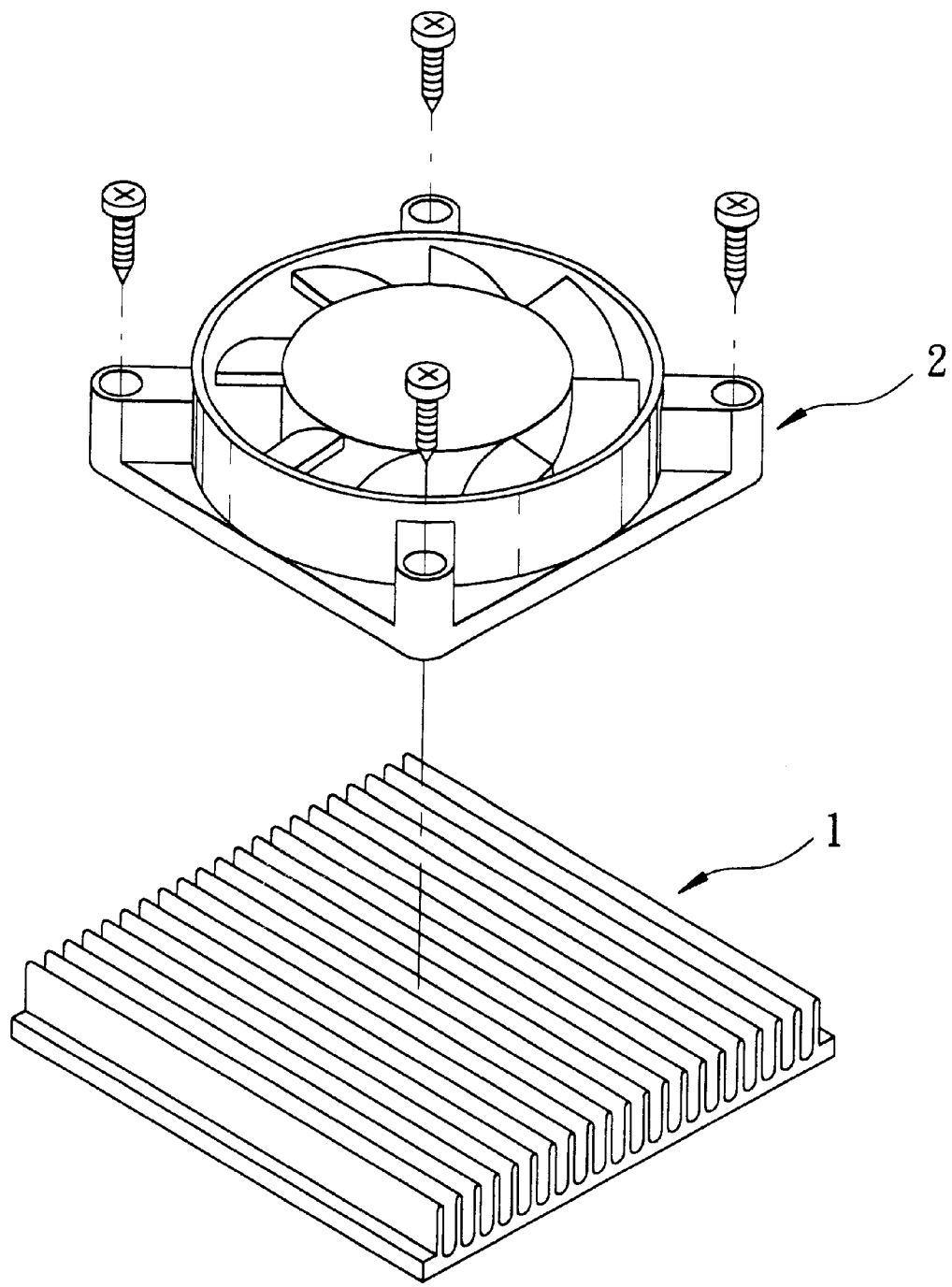
FIG. 1 is a perspective exploded view of a conventional heat-dissipating apparatus.
Figure 2:
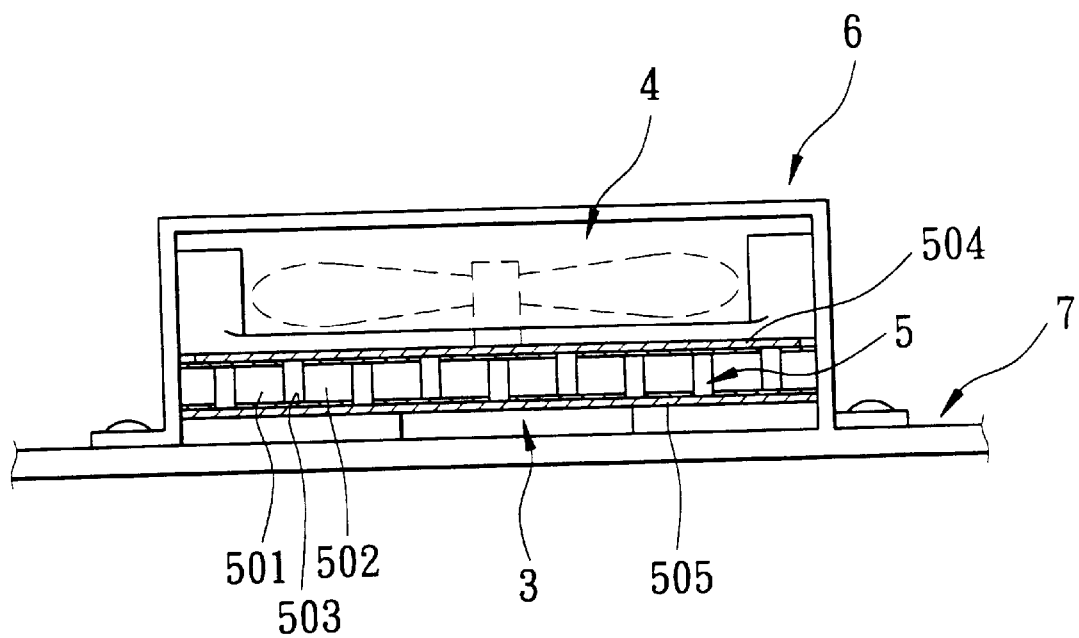
FIG. 2 is an assembled schematic view of another conventional heat-dissipating apparatus.
Figure 3:
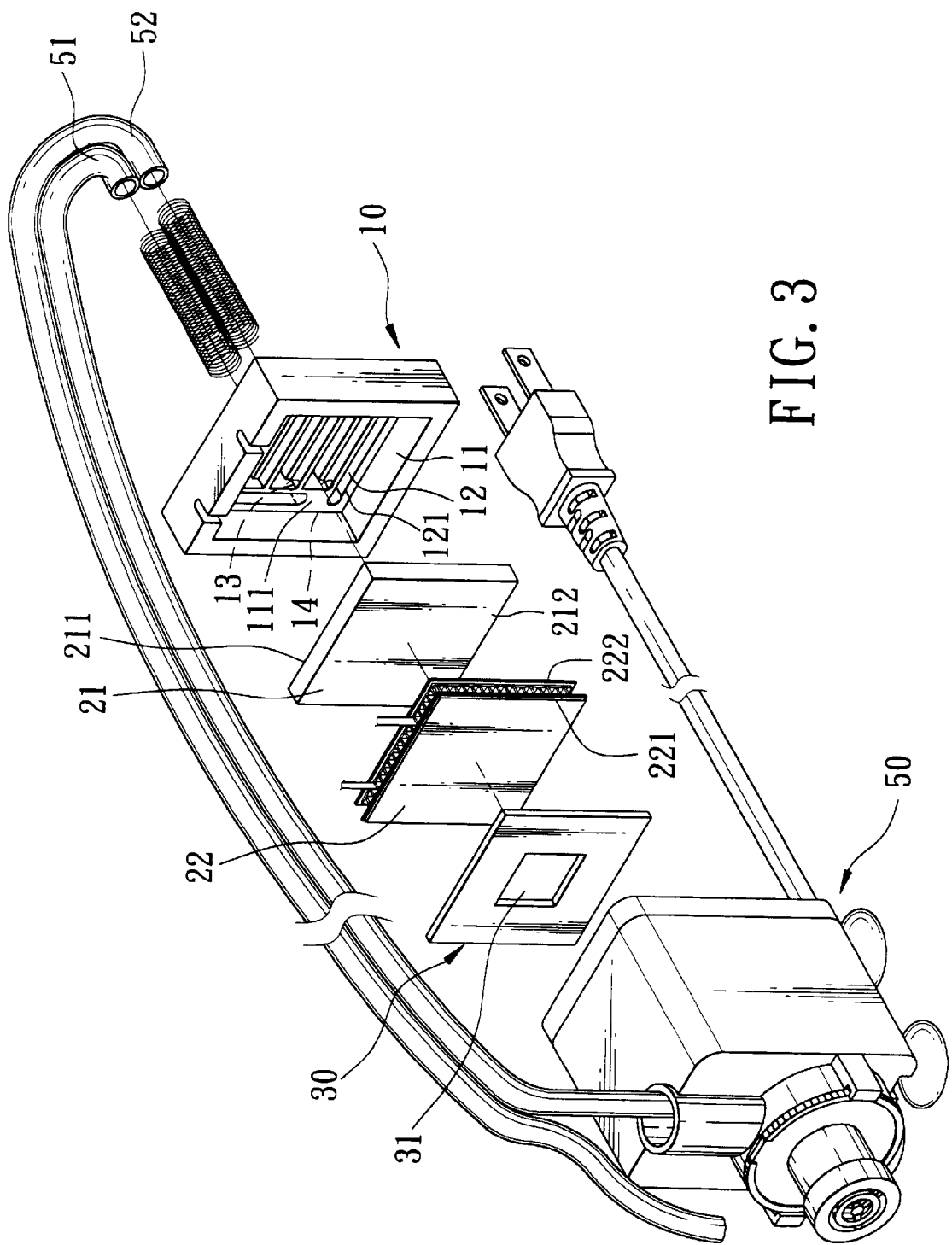
FIG. 3 is an exploded perspective view of the preferred embodiment of a heat-dissipating apparatus for an integrated circuit device according to the present invention.
Figure 4:
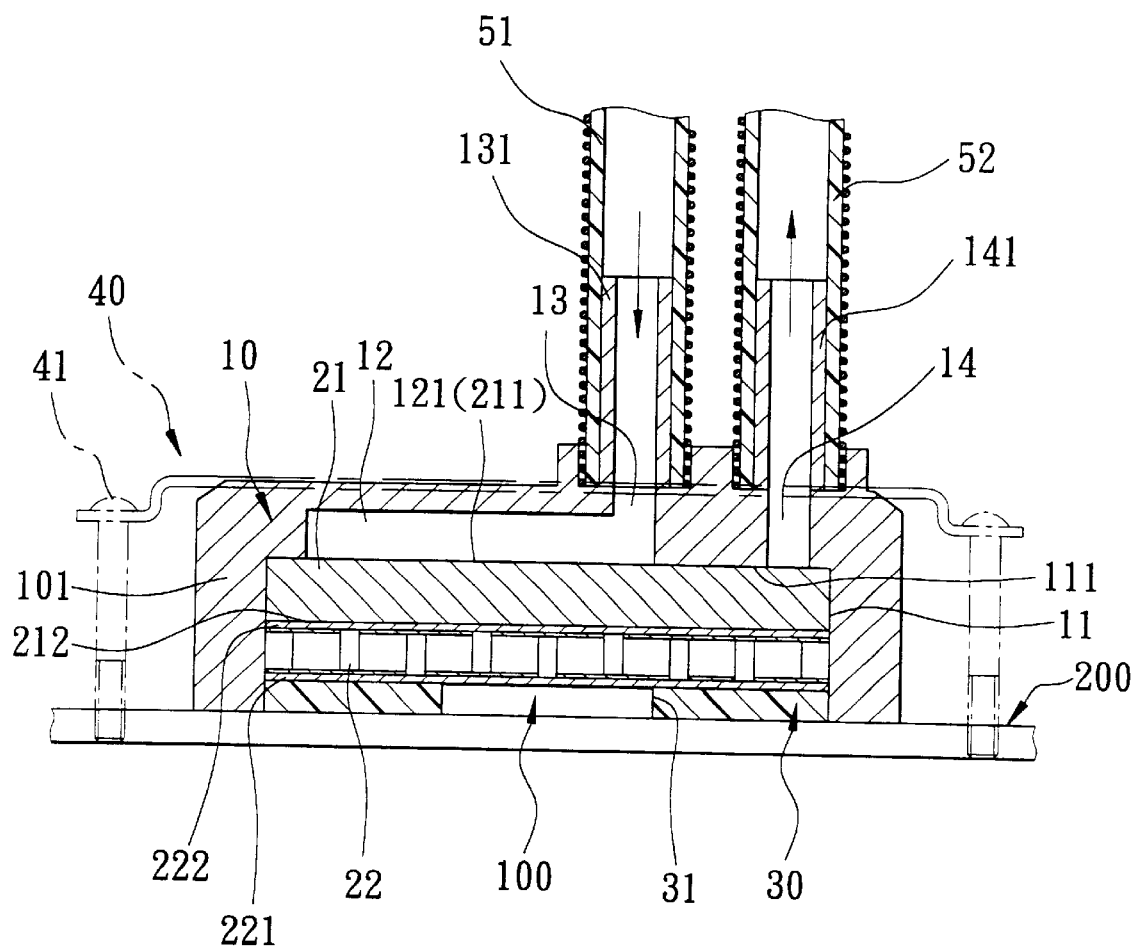
FIG. 4 is an assembled sectional view of the preferred embodiment.

Referring to FIGS. 3 and 4, the preferred embodiment of a heat-dissipating apparatus according to the present invention is adapted for dissipating heat released from a heat-generating side of an integrated circuit device 100 that is mounted on a circuit board 200. The heat-dissipating apparatus is shown to include a base member 10, a thermoelectric cooling unit 22 and a washer member 30.

In this embodiment, the base member 10 is a rectangular block having an upright surrounding wall portion 101 and a top wall 111. The surrounding wall portion 101 confines a receiving space 11 with an area larger than the integrated circuit device 100. The top wall 111 is formed on a top end of the surrounding wall portion 101 so as to close a top side of the receiving space 11. The base member 10 is adapted to be disposed on the circuit board 200 such that the integrated circuit device 100 is accommodated within the receiving space 11. The top wall 111 has an upper wall surface, and a lower wall surface opposite to the upper wall surface and formed with a serpentine fluid groove 12. The fluid groove 12 has an open bottom side 121 that opens downwardly, and opposing first and second groove ends. The top wall 111 further has a fluid inlet 13 in fluid communication with the first groove end, and a fluid outlet 14 in fluid communication with the second groove end.

The thermoelectric cooling unit 22 is disposed in the receiving space 11 below the top wall 111, and has a heat-absorbing side 221 adapted to be placed in contact with the heat-generating side of the integrated circuit device 100, and a heat-releasing side 222 opposite to the heat-absorbing side 221. The cooling unit 22 has a size corresponding to the area of the receiving space 11, and is adapted to separate the integrated circuit device 100 from the fluid groove 12. In this embodiment, the cooling unit 22 is a semiconductor device of the known type that includes an array of N-type and P-type semiconductor units. As such, a detailed description thereof is dispensed with herein for the sake of brevity.

The washer member 30, preferably formed from rubber, is disposed in the receiving space 11 below the cooling unit 22. The washer member 30 has inner and outer peripheral portions, and top and bottom surfaces. The inner peripheral portion is formed with a through hole 31 that is adapted to contain the integrated circuit device 100 therein. The outer peripheral portion establishes a fluid-tight seal with the surrounding wall portion 101 of the base member 10. The top surface establishes a fluid-tight seal with the heat-absorbing side 221 of the cooling unit 22. The bottom surface is adapted to establish a fluid-tight seal with the circuit board 200. As such, the cooling unit 22 is isolated from the circuit board 200, and only the central portion of the heat-absorbing side 221 is in contact with the integrated circuit device 100. As for the portion of the heat-absorbing side 221 that is not in contact with the integrated circuit device 100, it will not come into contact with the ambient air due to the arrangement of the washer member 30 disposed therebelow.

The heat-dissipating apparatus may further include a heat conductive plate 21, a fluid inlet pipe 131, a fluid outlet pipe 141 and a fluid pump 50. The heat conductive plate 21, preferably formed from an aluminum alloy, is mounted in the receiving space 11 below the top wall 111. The heat conductive plate 21 has a top side 211 that closes the open bottom side 121 of the fluid groove 12, and a bottom side 212 that is in heat-conductive contact with the heat-releasing side 222 of the cooling unit 22. It should be noted that the heat conductive plate 21 may be dispensed with in the present invention. In this case, the heat-absorbing side 221 of the cooling unit 22 may be arranged directly below the open bottom side 121 of the fluid groove 12.

The fluid inlet pipe 131 is mounted on the upper wall surface of the top wall all and is in fluid communication with the fluid inlet 13.

The fluid outlet pipe 141 is mounted on the upper wall surface of the top wall 111 and is in fluid communication with the fluid outlet 14.

The fluid pump 50 is connected to the fluid inlet pipe 131 and the fluid outlet pipe 141, and includes a supply hose 51 for passage of a cooling fluid, such as water, to the fluid groove 12 via the fluid inlet pipe 131, and a draw hose 52 for passage of the cooling fluid that is drawn from the fluid groove 12 via the fluid outlet pipe 141.

During assembly, the heat conductive plate 21 is searingly disposed in the receiving space 11 of the base member 10 using a bonding agent or the like. The cooling unit 22 is then mounted in the receiving space 11 such that the heat-releasing side 222 contacts the bottom side 212 of the heat conductive plate 21. Thereafter, the washer member 30 is disposed in the receiving space 11 with the top surface thereof establishing a fluid-tight seal with the heat-absorbing side 221 of the cooling unit 22. When the resulting assembly is mounted on the circuit board 200, the washer member 30 is fitted over the integrated circuit device 100 such that the heat-absorbing side 221 of the cooling unit 22 contacts the heat-generating side of the integrated circuit device 100. A mounting bracket 40 may be employed to secure the base member 10 on the circuit board 200 by means of screw fasteners 41. Subsequently, the fluid inlet and outlet pipes 131, 141 are respectively connected to the supply and draw hoses 51, 52 of the fluid pump 50, and the fluid pump 50 is connected to a cooling fluid source (not shown).

When the integrated circuit device 100 is in operation, the heat generated thereby is transferred via the heat-absorbing side 221 to the heat-releasing side 222, and is further transferred to the open bottom side 121 of the fluid groove 12 via the heat conductive plate 21. When the fluid pump 50 is actuated, the cooling fluid is drawn from the fluid source and passes through the supply hose 51 and the fluid inlet pipe 131 into the fluid groove 12. After traveling through the serpentine fluid groove 12, the cooling fluid is discharged via the fluid outlet pipe 141 and returns to the fluid source via the draw hose 52. The process is cyclically repeated to dissipate the heat generated by the integrated circuit device 100.

By virtue of the arrangement of the washer member 30 below the cooling unit 22, the heat-absorbing side 221 of the cooling unit 22 can be isolated from the ambient air so as to prevent condensation of water droplets on the part of the heat-absorbing side 221 that is not in contact with the integrated circuit device 100, thereby prolonging the service life of the circuit board 200.

Figure 5:
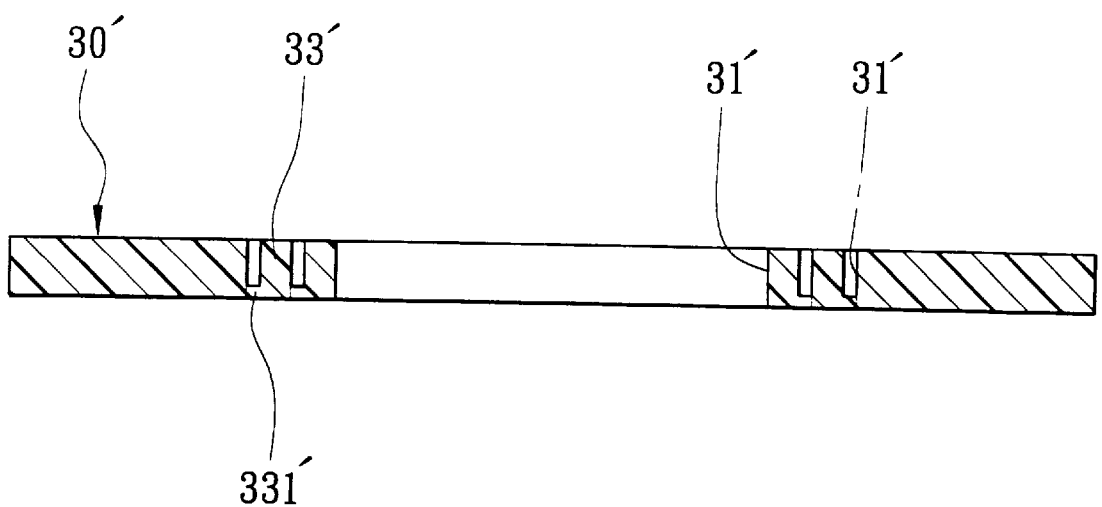
FIG. 5 is a sectional schematic view of a modified washer of the heat-dissipating apparatus according to the present invention.

With reference to FIG. 5, as the specifications of conventional integrated circuit devices vary, the washer member 30' may be configured to have the inner peripheral portion thereof formed with a plurality of concentric hole defining sections 33'. Adjacent ones of the hole defining sections 33' are interconnected by a tearable tab 331'. As such, the user can select a proper size of the through hole 31' to accommodate the specification of the integrated circuit device to which the heat-dissipating apparatus is to be applied.

In sum, the heat-dissipating apparatus of the invention is simple to construct and assemble, provides an enhanced effect, and contributes to lengthening of the service life of circuit boards.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A heat dissipating apparatus for dissipating heat released from a heat-generating side of an integrated circuit device that is mounted on a circuit board, said heat-dissipating apparatus comprising:

a base member having an upright surrounding wall portion that confines a receiving space with an area larger than the integrated circuit device, and a top wall that is formed on a top end of said surrounding wall portion so as to close a top side of said receiving space, said base member being adapted to be disposed on the circuit board such that the integrated circuit device is accommodated within said receiving space, said top wall having an upper wall surface and a lower wall surface opposite to said upper wall surface and formed with a serpentine fluid groove that opens downwardly and that has opposing first and second groove ends, said top wall further having a fluid inlet in fluid communication with said first groove end, and a fluid outlet in fluid communication with said second groove end;

a thermoelectric cooling unit disposed in said receiving space below said top wall and having a heat-absorbing side adapted to be placed in contact with the heat-generating side of the integrated circuit device, and a heat-releasing side opposite to the heat-absorbing side, said cooling unit having a size corresponding to the area of the receiving space and being adapted to separate the integrated circuit device from said fluid groove; and a washer member disposed in said receiving space below said cooling unit, said washer member having an inner peripheral portion formed with a through hole that is adapted to contain the integrated circuit device therein, an outer peripheral portion that establishes a fluid-tight seal with said surrounding wall portion of said base member, a top surface that establishes a fluid-tight seal with said heat-absorbing side of said cooling unit, and a bottom surface that is adapted to establish a fluid-tight seal with the circuit board.

2. The heat-dissipating apparatus of claim 1, further comprising a heat conductive plate mounted in said receiving space below said top wall to close a bottom side of said fluid groove, and in heat-conductive contact with said heat-releasing side of said cooling unit.

3. The heat-dissipating apparatus of claim 2, wherein said heat conductive plate is formed from an aluminum alloy.

4. The heat-dissipating apparatus of claim 1, further comprising:

a fluid inlet pipe mounted on said upper wall surface of said top wall and in fluid communication with said fluid inlet;

a fluid outlet pipe mounted on said upper wall surface of said top wall and in fluid communication with said fluid outlet; and a fluid pump connected to said fluid inlet pipe and said fluid outlet pipe, said fluid pump supplying cooling fluid to said fluid groove via said fluid inlet pipe, and drawing the cooling fluid from said fluid groove via said fluid outlet pipe.

5. The heat-dissipating apparatus of claim 4, wherein the cooling fluid is water.

6. The heat-dissipating apparatus of claim 1, wherein said washer member is formed from rubber.

7. The heat-dissipating apparatus of claim 6, wherein said inner peripheral portion of said washer member is formed with a plurality of concentric hole defining sections, adjacent ones of said hole defining sections being interconnected by a tearable tab.

8. The heat-dissipating apparatus of claim 1, wherein said cooling unit is a semiconductor device that includes an array of N-type and P-type semiconductor units.

* * * * *